United States Patent
Tikka et al.

(10) Patent No.: US 6,992,400 B2
(45) Date of Patent: Jan. 31, 2006

(54) ENCAPSULATED ELECTRONICS DEVICE WITH IMPROVED HEAT DISSIPATION

(75) Inventors: Pasi Tikka, München (DE); Edgar Schmidhammer, Stein (DE); Habbo Heinze, Unterschleissheim (DE); Reiner Welzer, München (DE); Herbert Zidek, Munich (DE); Ansgar Schäufele, Munich (DE); Juha Ellä, Halikko (FI)

(73) Assignees: Nokia Corporation, Espoo (FI); Epcos AG, Munich (DE)

(*) Notice: Subject to any disclaimer, the term of this patent is extended or adjusted under 35 U.S.C. 154(b) by 6 days.

(21) Appl. No.: 10/769,460

(22) Filed: Jan. 30, 2004

(65) Prior Publication Data
US 2005/0167854 A1    Aug. 4, 2005

(51) Int. Cl.
*H01L 23/28*    (2006.01)
(52) U.S. Cl. .................................. 257/787; 257/788
(58) Field of Classification Search ................ 257/787, 257/788, 789, 790, 792
See application file for complete search history.

(56) References Cited

U.S. PATENT DOCUMENTS

| 6,057,222 | A | 5/2000 | Pahl et al. ............... 438/612 |
| 6,081,171 | A | 6/2000 | Ellä et al. ............... 333/189 |
| 6,492,194 | B1 * | 12/2002 | Bureau et al. ............ 438/106 |
| 6,509,813 | B2 | 1/2003 | Ellä et al. ............... 333/187 |
| 6,528,924 | B1 | 3/2003 | Stelzl et al. ............. 310/313 |
| 6,555,758 | B1 | 4/2003 | Stelzl et al. ............. 174/260 |
| 2003/0047806 | A1 | 3/2003 | Stelzl et al. ............. 257/730 |

FOREIGN PATENT DOCUMENTS

| WO | WO 03/012856 | 2/2003 |
| WO | WO 03/032484 | 4/2003 |

\* cited by examiner

*Primary Examiner*—David Nelms
*Assistant Examiner*—Thinh T Nguyen
(74) *Attorney, Agent, or Firm*—Ware, Fressola, Van Der Sluys & Adolphson LLP

(57) ABSTRACT

A method for improving heat dissipation in an encapsulated electronic package usually referred to as a chip-size SAW package. The package comprises one or more acoustic-wave components fabricated on a die, which is disposed on an electrically non-conductive carrier separated by electrically conducting bumps. The top of the package is covered by a laminate and a hermetic seal layer. Heat dissipation can be improved by removing a part of the laminate and then depositing a layer of thermal conducting material on the package, and by providing one or more heat conducting paths through the carrier.

9 Claims, 6 Drawing Sheets

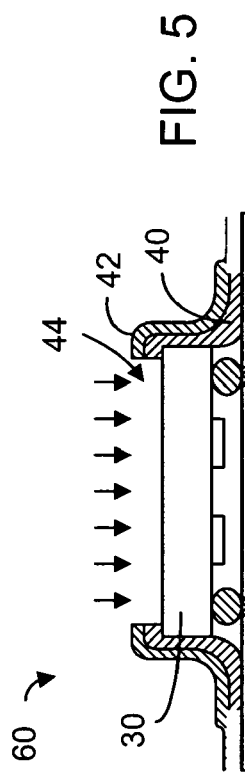
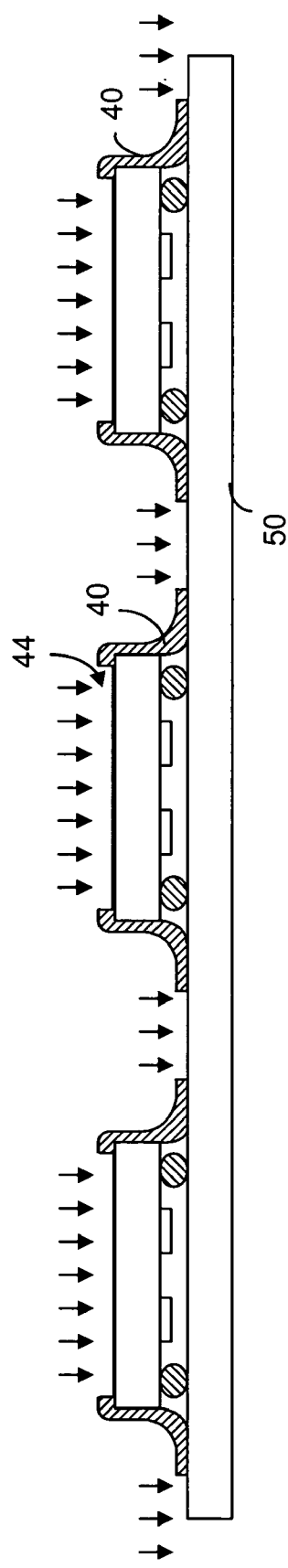
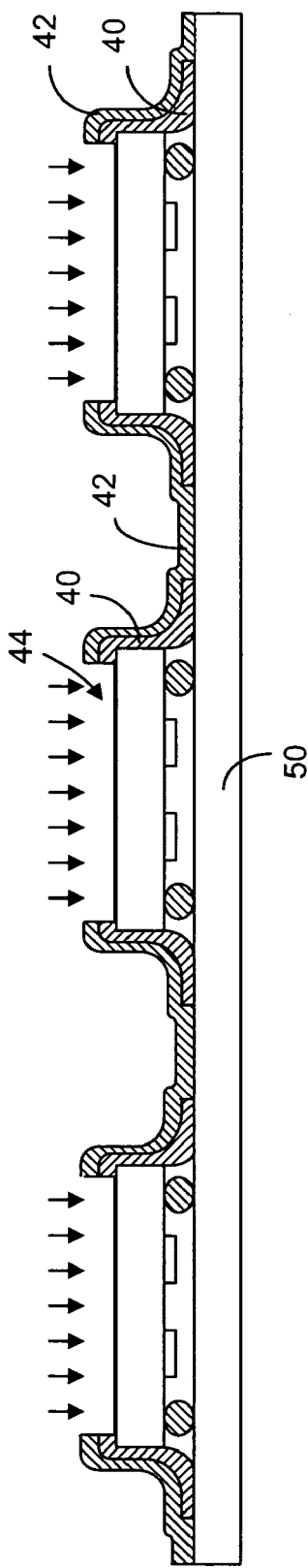

ENCAPSULATED ELECTRONICS DEVICE WITH IMPROVED HEAT DISSIPATION

The invention claimed herein was made by or on behalf of EPCOS AG and Nokia Corporation through its wholly owned subsidiary NOKIA MOBILE PHONES LTD who are parties to a joint research agreement signed by EPCOS on Jan. 4, 2001 and by NOKIA MOBILE PHONES LTD on Jan. 19, 2001 relating at least to the field of the invention as described immediately below.

FIELD OF THE INVENTION

The present invention relates generally to encapsulated electronic components and, more particularly, to chip-size SAW package.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical/acoustic wave (produced by the RF signal) is about twice the thickness of the piezoelectric layer. Although the resonant frequency of a BAW device also depends on other factors, the thickness of the piezoelectric layer is the predominant factor in determining the resonant frequency. As the, thickness of the piezoelectric layer is reduced, the resonant frequency is increased. BAW devices have traditionally been fabricated on sheets of quartz crystals. In general, it is difficult to achieve a device of high resonant frequency using this fabrication method. In fabricating BAW devices by depositing thin-film layers on passive substrate materials, one can extend the resonant frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). The difference between these two types of devices lies mainly in their structures. An SCF usually has two or more piezoelectric layers and three or more electrodes, with some electrodes being grounded. FBARs are usually used in combination to produce passband or stopband filters. The combination of one series FBAR and one shunt FBAR makes up one section of the so-called ladder filter. The description of ladder filters can be found, for example, in Ella (U.S. Pat. No. 6,081,171). As disclosed in Ella, an FBAR-based device may have one or more protective layers, commonly referred to as the passivation layers. A typical FBAR-based device is shown in FIG. 1. As shown in FIG. 1, the FBAR device 1 comprises a substrate 2, a bottom electrode 4, a piezoelectric layer 6, a top electrode 8, a tuning layer 20, and a passivation layer 10. The FBAR device 1 may additionally include an acoustic mirror 12, which is comprised of a layer 16 of high acoustic impedance sandwiched between two layers 14 and 18 of low acoustic impedance. The mirror usually, but not always, consists of pairs of high and low impedance layers (an even number of layers). Some mirrors consist of two pairs of such layers arranged in a sequence like SiO2, W, SiO2, W. Instead of the mirror, an FBAR device may additionally include one or more membrane layers of SiO2 and a sacrificial layer. The substrate 2 can be made from silicon (Si), silicon dioxide (SiO2), Galium Arsenide (GaAs), glass, or ceramic materials. The bottom electrode 4 and top electrode 8 can be made from gold (Au), molybdenum (Mo), tungsten (W), copper (Cu), nickel (Ni), niobium (Nb), silver (Ag), tantalum (Ta), cobalt (Co), aluminum (Al), titanium (Ti) or other electrically conductive materials. The piezoelectric layer 6 can be made from zinc oxide (ZnO), zinc sulfide (ZnS), aluminum nitride (AlN), lithium tantalate ($LiTaO_3$) or other members of the so-called lead lanthanum zirconate titanate family. The passivation layer can be made from SiO2, Si3N4 or polyimide. The low acoustic impedance layers 14 and 18 can be made from Si, SiO2, poly-silicon, Al or a polymer. The high acoustic impedance layer 16 can be made from Au, Mo or tungsten (W), and in some cases, dielectric such as AlN to make a number of layer pairs. FBAR ladder filters are typically designed so that the series resonators yield a series resonance at a frequency that is approximately equal to, or near, the desired, or designed, center frequency of the respective filters. Similarly, the shunt, or parallel, resonators yield a parallel resonance at a frequency slightly offset from the series FBAR resonance. The series resonators are usually designed to have their maximum peak in transmission at the center frequency, so signals are transmitted through the series resonators. In contrast, the shunt resonators are designed to have their minimum in transmission so that signals are not shorted to ground. FBARs yield parallel resonance and series resonance at frequencies that differ by an amount that is a function of a piezoelectric coefficient of the piezoelectric materials used to fabricate the devices, in addition to other factors such as the types of layers and other materials employed within in the device. In particular, FBAR ladder filters yield passbands having bandwidths that are a function of, for example, the types of materials used to form the piezoelectric layers of the resonators and the thickness of various layers in the device.

Flip-chip technology has been used to assemble FBAR filters in an encapsulated package. Flip-chip is a term that describes a method of electrically connecting a die to a package carrier. A die is basically a substrate having one or more active components, such as FBAR filters fabricated thereon, as shown in FIG. 2. As shown, the die 30 comprises a substrate 2 and two active components or chips 1. The substrate is usually part of a silicon wafer. The package carrier is a circuit board made of a low temperature cofired ceramic (LTCC) or high temperature cofired ceramic (HTCC). In the process of making a flip-chip package, the die is placed face down, so that the chips 1 are facing the package carrier. The electrical contacts between the die and the package carrier are realized by a plurality of wires bonded to the die and the package carrier. More commonly, electrically conductive "bumps" are disposed between the die and the package carrier.

The flip-chip process is shown in FIGS. 3a to 3d. As shown in FIG. 3a, a plurality of dies 30 are mounted on a package carrier 50, electrically connected by a plurality of bumps 52. A layer of lamination material 40 is deposited on top of the package, covering the entire die 30 and the area between neighboring dies, as shown in FIG. 3b. The laminate 40 is typically made of polyimide, such as Espandex™ Adhesiveless Polyimide. While the laminate 40 can provide mechanical protection for the chips 1 and the die 30, it is not hermetic. Over time, water vapor can penetrate the laminate 40 to cause damages to the chips. Thus, a different material is used to hermetically seal the package against contaminants. For that reason, part of the laminate 40 that covers the area between neighboring dies 30 is removed to expose some sections of the package carrier 50, as shown in FIG. 3c. A hermetic seal layer 42 is applied on top of the laminate 40 and sections of the package carrier 50, as shown in FIG. 3d. The hermetic seal layer 42 is usually made of copper or the like. Subsequently, the package carrier is cut into individual packages 60, as shown in FIG. 4.

An individual package 60 is shown in FIG. 4. The package is commonly referred to as chip-size SAW package (CSSP). As shown in the figure, the chips 1 inside the package are electrically connected to an external electrical circuit 70 through a plurality of bumps 52 and interconnecting vias 54. The circuit 70 is also known as surface-mount device (SMD) pad, and the interconnecting vias 54 are referred to as through-contactings.

In typical FBAR filters, especially under high power levels, the internal heat distribution inside the filter chip can be a problem. The uneven internal heat distribution limits the highest usable power level with the FBAR filter or duplexer. In particular, when the FBAR filters and duplexers are disposed in an encapsulated package, heat dissipation is a major concern. It is advantageous and desirable to improve heat dissipation in such a package in order to enhance the power durability.

SUMMARY OF THE INVENTION

It is a primary objective of the present invention to improve heat dissipation in an encapsulated electronic package, wherein the package comprises one or more electronic components fabricated on a die, which is disposed on an electrically non-conductive carrier. The die is electrically connected to an external circuit via a plurality of electrically conductive bumps between the die and the upper surface of the carrier, and a plurality of interconnecting vias connecting the upper surface to the lower surface of the carrier. On top of the package, a laminate and a hermetic seal metal layer covering the backside of the die are used to encapsulate the electronic components therein. The objective can be achieved by 1) reducing or eliminating a part of the laminate covering the top of the package;
2) depositing a layer of thermal conducting material on the top of the package, wherein the thermal conducting material is also used as part of the hermetic seal, and
3) providing one or more heat paths through the carrier, thermally connecting the hermetic seal on the upper surface of the carrier to thermally conductive elements on the lower surface of the carrier.

Thus, the first aspect of the present invention provides a method for improving heat dissipation in an encapsulated electronic device, the encapsulated device comprising:

a carrier having a first surface and an opposing second surface;

a plurality of electrically conductive bumps disposed on the first surface of the carrier;

a plurality of electrically conductive segments disposed on the second surface of the carrier;

a plurality of electrically conductive paths, provided between the first and second surfaces of the carrier, for electrically connecting the bumps to the electrically conductive segments;

a die disposed on top of the bumps, electrically connected to the electrically conductive segments via the electrically conductive paths and the bumps;

a laminate provided on top of the die and at least a part of the first surface of the carrier; and a hermetic seal layer covering the laminate and another part of the first surface of the carrier. The method comprises removing a portion of the laminate on top of the die for providing a cleared area; and providing a thermal conducting layer on the cleared area, so as to improve heat dissipation of the encapsulated device through the thermal conducting layer.

The method further comprises providing at least one heat conducting path through the carrier, thermally connecting the hermetic seal layer on the first surface of the carrier to the second surface of the carrier.

The thermal conducting layer may comprise a metal layer, and a further hermetic seal layer.

The thermal conducting layer may be extended outside the cleared area to cover at least a part of the remaining laminate portion.

According to the present invention, the die comprises one or more acoustic-wave devices, including FBAR devices. The FBAR device may comprise an acoustic mirror, a substrate and a thermal conducting dielectric layer, such as aluminum nitride, disposed between the acoustic mirror and the substrate.

The second aspect of the present invention provides an encapsulated electronic device, which comprises:

a carrier having a first surface and an opposing second surface;

a plurality of electrically conductive bumps disposed on the first surface;

a plurality of electrically conductive segments disposed on the second surface;

a plurality of electrically conductive paths, provided between the first and second surfaces of the carrier, for electrically connecting the bumps to the electrically conductive segments on the second surface;

a die having a first surface and a second surface, the die disposed on top of the bumps, electrically connecting the first surface of the die to the electrical conductive segments on the second surface of the carrier through the electrically conductive paths and the bumps, wherein the second surface of the die has an inner area and an outer area surrounding the inner area;

a laminate provided at least on the outer area of the second surface of the die and at least a part of the first surface of the carrier; and a hermetic seal layer covering the laminate, the inner area of the second surface of the die, and another part of the first surface of the carrier, wherein the hermetic seal layer comprises a thermally conductive layer.

The hermetic seal layer covering the inner area of the second surface of the die is thicker than the hermetic seal layer covering the laminate.

The laminate may also be provided on the inner area between the second surface of the die and the hermetic seal layer, and wherein the laminate provided on the inner area is thinner than the laminate covering the outer area of the second surface.

The device may further comprise at least one heat conducting path through the carrier, thermally conducting the hermetic seal layer on the first surface of the carrier to the second surface of the carrier.

The present invention will become apparent upon reading the detailed description taken in conjunction with FIGS. 5 to 10.

BRIEF DESCRIPTION OF THE DRAWINGS

FIG. 5 is a schematic representation showing the laminate on top of a CSSP being removed, according to the present invention.

FIG. 6a is a schematic representation showing the laminate on top of the CSSPs being removed during the flip-chip packaging process.

FIG. 6b is a schematic representation showing the laminate on top of the CSSPs being removed in another step during the flip-chip packaging process.

DETAILED DESCRIPTION OF THE INVENTION

Figure 1:
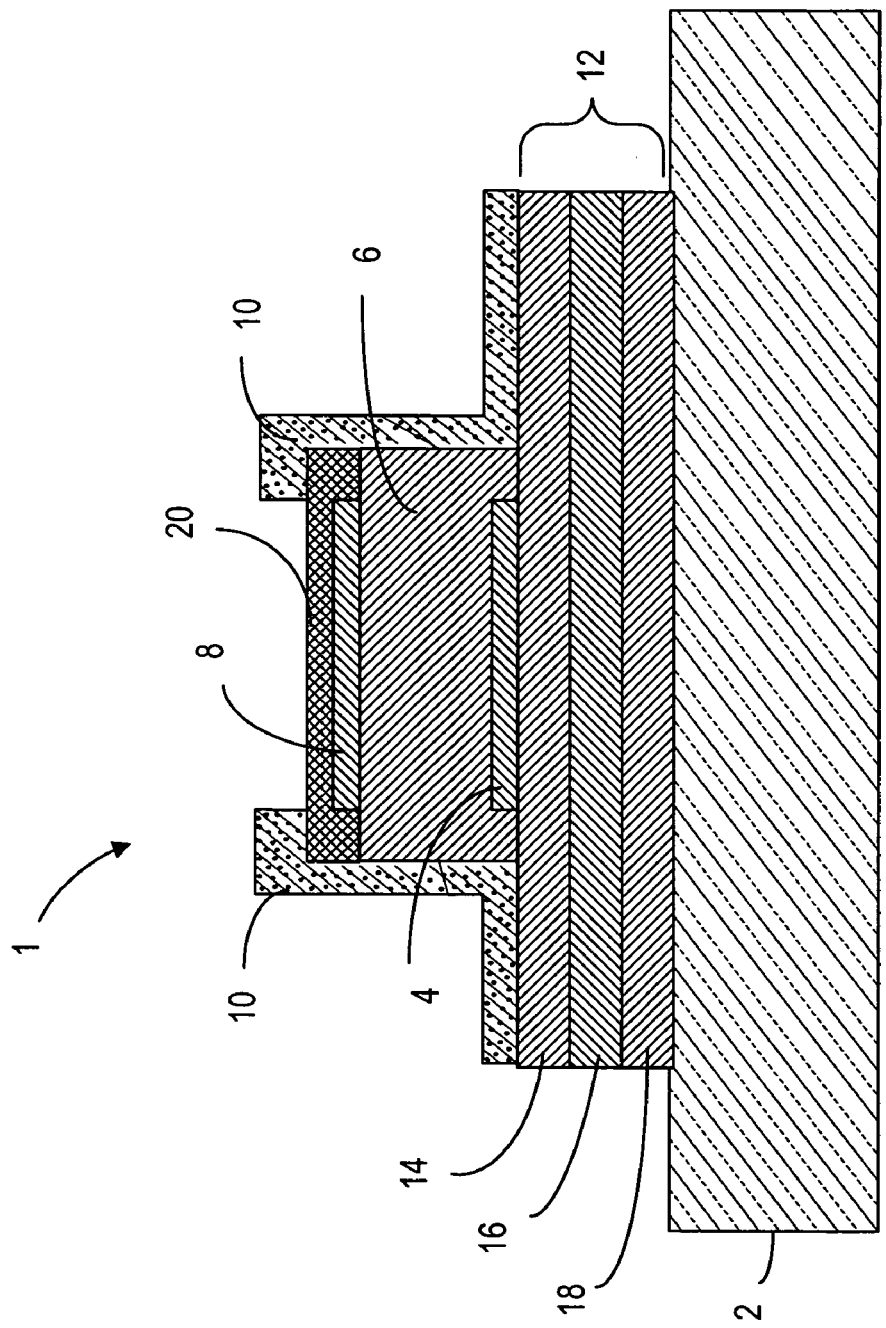
FIG. 1 is a schematic representation showing a thin-film bulk acoustic resonator.
Figure 2:
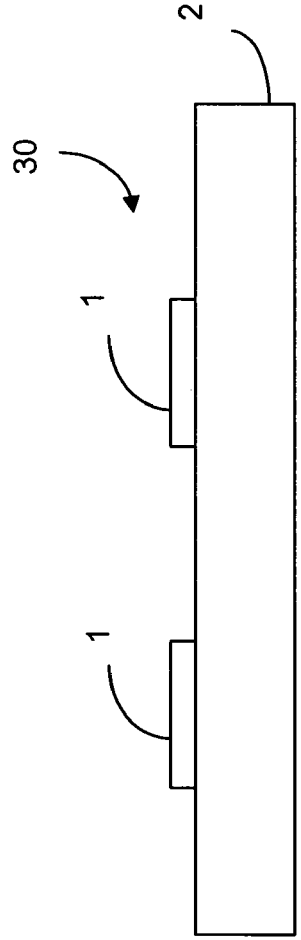
FIG. 2 is a schematic representation showing a die.
Figure 3A:
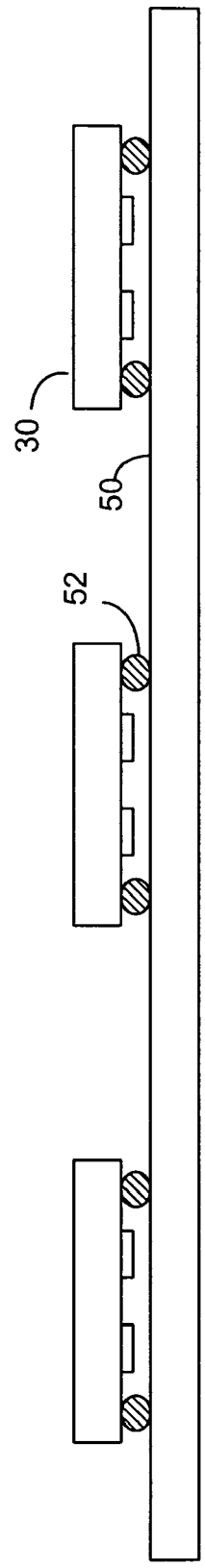
FIG. 3a is a schematic representation showing a plurality of dies being mounted on a carrier in a flip-chip packaging process.
Figure 3B:
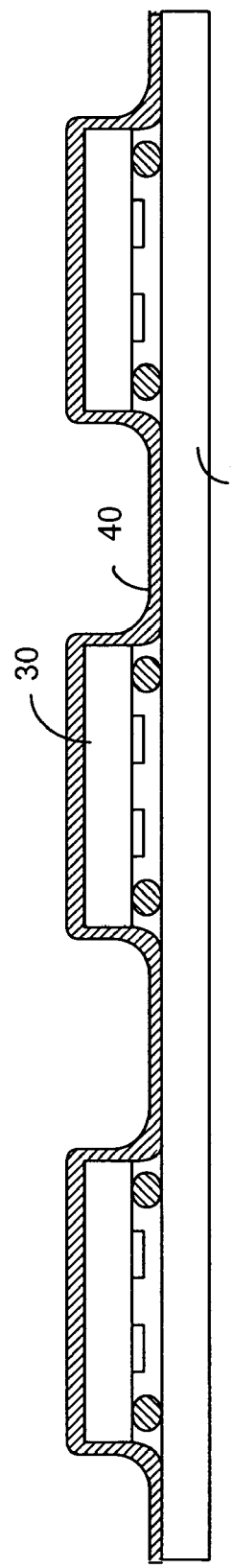
FIG. 3b is a schematic representation showing a laminate being applied on top of the carrier and the dies mounted thereon.
Figures 3C, 3D, 4:
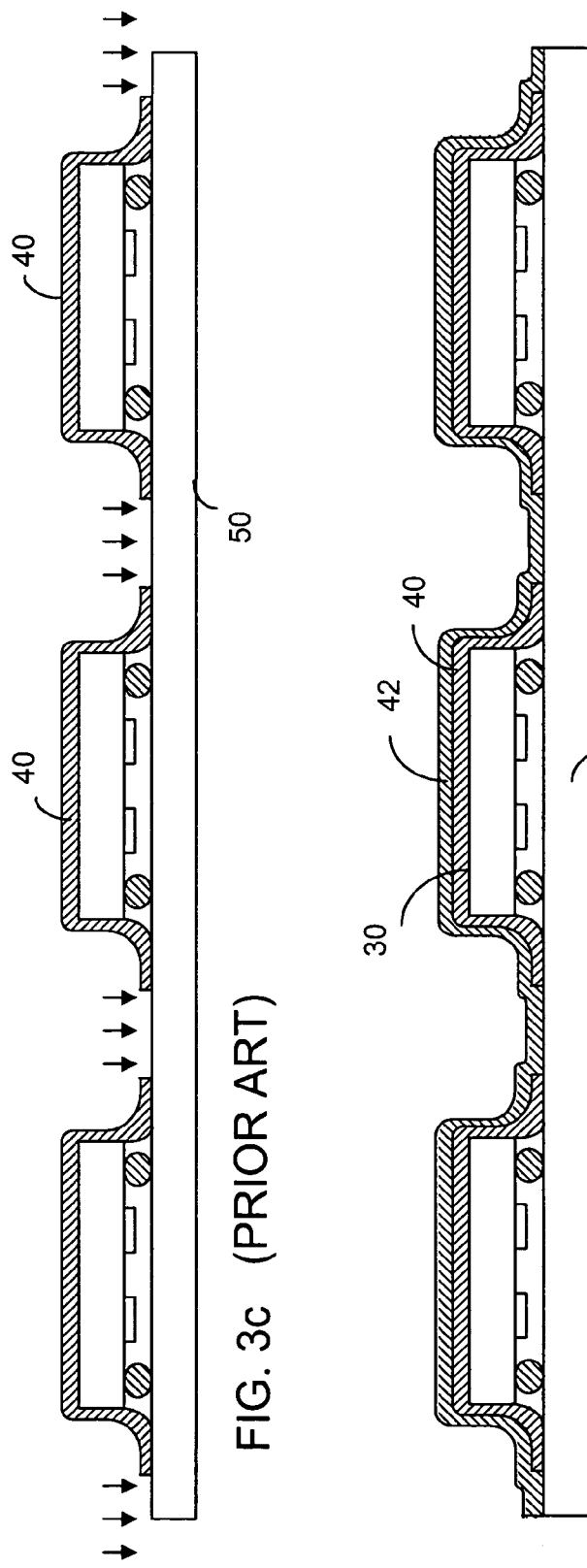
FIG. 3c is a schematic representation showing part of the laminate being removed.
FIG. 3d is a schematic representation showing a hermetic seal layer being applied on top of the laminate.
FIG. 4 is a schematic representation showing an individual chip-size SAW package (CSSP).

In an encapsulated package, such as the chip-size SAW package (CSSP) shown in FIG. 4, the heat produced inside the encapsulated package can be partly dissipated through the laminate 40 and the hermetic seal layer 42, and partly through the carrier 50 and the interconnecting vias 54. The laminate 40 is usually made of polyimide. In a typical CSSP, the laminate is about 40 μm thick in order to provide adequate mechanical protection for the electronic components in the package. The hermetic seal layer 42 is usually very thin coating of copper, about 10 μm. This hermetic seal layer itself is not sufficient to provide adequate mechanical protection. Furthermore, without the laminate, the thin copper layer cannot be directly deposited on top of the package to seal off the gap between the die 30 and the upper surface of the package carrier 50. The laminate 40 provides a smoother transition from the die 30 to the upper surface of the carrier 50. However, the laminate 40 is a poor thermal conductor, and the layer structure in a CSSP is not effective in heat removal.

According to the present invention, heat removal can be improved by reducing or eliminate an area of the laminate 40 on top of the package 60. After the laminate 40 is partially removed or reduced, a cleared area 44 is produced on top of the package 60. The laminate 40 can be removed in many different ways. For example, a laser cutting machine can be used to remove part of the laminate in individual packages 60, as shown in FIG. 5.

Alternatively, before the hermetic seal layer 42 is deposited on top of the laminate 40 (FIG. 3c), a part of laminate on top of the packages 60 can be removed along with the laminate areas between the packages, as shown in FIG. 6a. When the hermetic seal layer 42 is deposited on top of the laminate 40 in the flip-chip packaging process, part of the hermetic seal layer 42 fills the cleared section 44. As such, the hermetic seal layer 42 is either in direct contact with the die 30, or it is separated from the die 30 by a thin layer of laminate material.

It is also possible to remove the laminate areas on top of the packages 60 along with part of the hermetic seal layer, after the hermetic seal layer 42 is deposited on top of the laminate 40, as shown in FIG. 6b.

Figure 7:
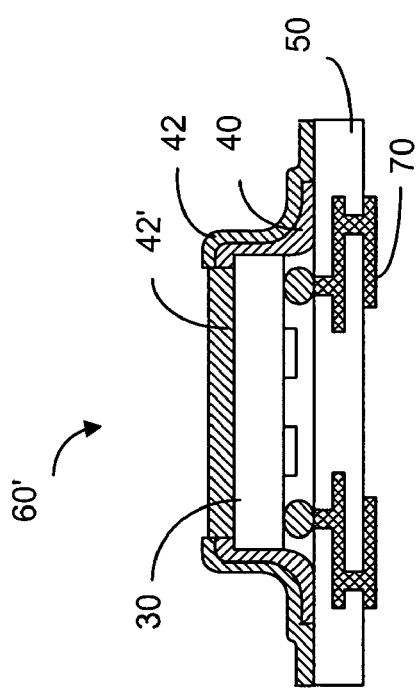
FIG. 7 is a schematic representation showing a thick layer of hermetic seal material deposited on top of a modified CSSP to improve heat dissipation, according to the present invention.

In order to increase the heat removal function of the hermetic seal layer, it is preferable to deposit a thicker hermetic seal layer 42' on top of the cleared section 44, as shown in FIG. 7. The thickness of the hermetic seal layer on top of the package can be 100 μm, for example.

Figure 8:
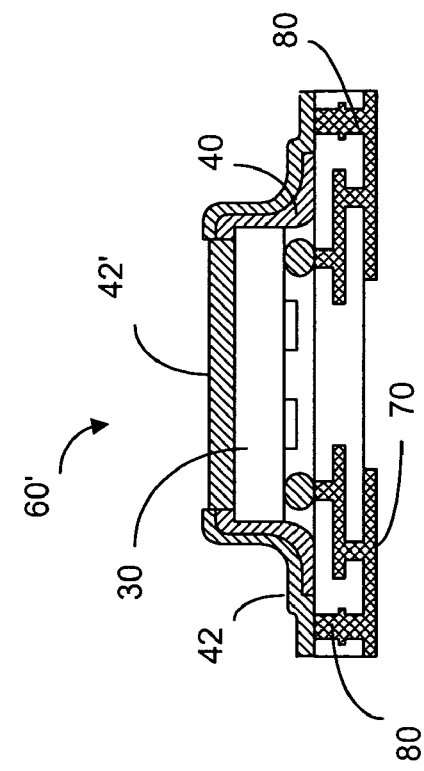
FIG. 8 is a schematic representation showing heat paths provided in the carrier of the CSSP, according to the present invention.

Heat dissipation in the package 60 can also be further improved by providing a plurality of thermal vias 80, as shown in FIG. 8. The thermal vias 80 provide the heat paths from the hermetic seal layer 42 on the upper surface of the carrier to the lower surface of the carrier 50. On the lower surface, the heat paths can be connected to a ground plane in the SMD (surface mount device), for example.

Figure 10:
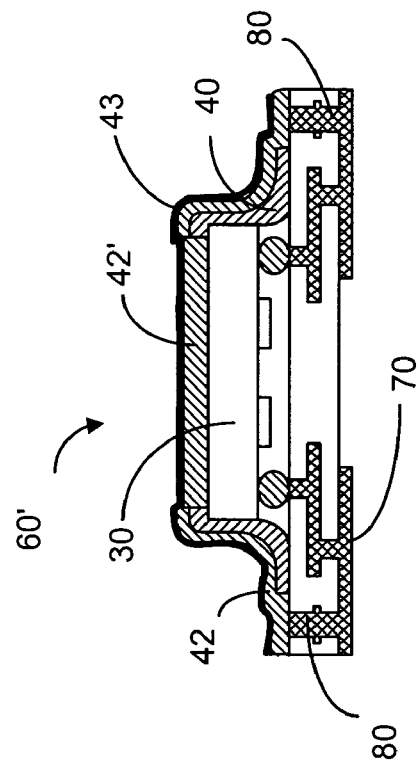
FIG. 10 is a schematic representation showing a heat conducting layer disposed on top of the hermetic seal material to further improve heat dissipation.
Figure 9:
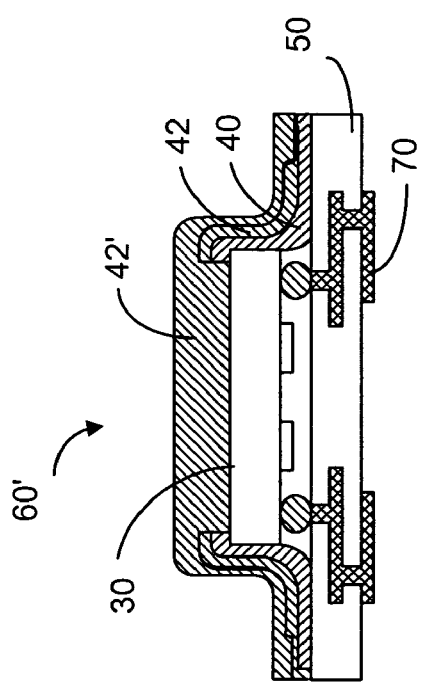
FIG. 9 is a schematic representation showing another embodiment of the present invention.

It should be noted that the hermetic seal portion 42 covering the laminate 40 and the hermetic seal portion 42' covering the cleared area 44 over the die 30 (see FIGS. 5–6b, 7 and 8) can be made of the same material so they can be deposited concurrently after the cleared area 44 is made (see FIG. 6a). Alternatively, the portion 42 and the portion 42' can be different. The hermetic seal portion 42' can also overlap with the portion 42, or even cover the entire package 60' as shown in FIG. 9. Furthermore, an additional thermal conductive layer 43, hermetic or not, can be disposed on top of the hermetic seal 42' to further improve heat dissipation, as shown in FIG. 10. Moreover, the cleared area 44 is not necessarily free of the laminate material, so long as the remnant is sufficient thin so it does not act as a thermal barrier.

Figure 11:
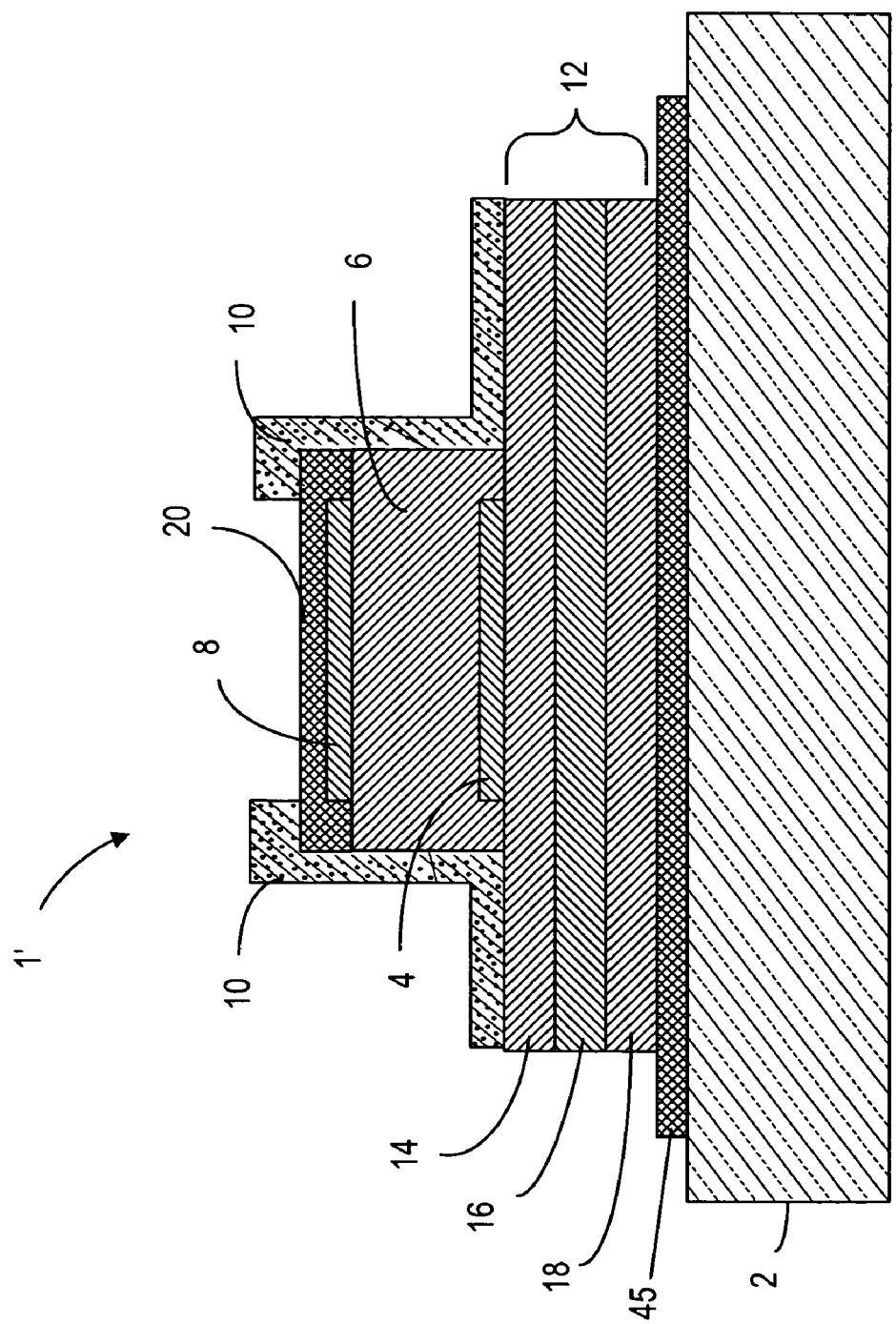
FIG. 11 is a schematic representation showing a FBAR device having a thermal conducting dielectric layer disposed between the acoustic mirror and the substrate, according to the present invention.

It is possible to further improve heat distribution within the CSSP by disposing a heat distribution layer 45 between the acoustic mirror and the substrate in a FBAR device 1', as shown in FIG. 11. The layer 45 can be made of aluminum nitride (AlN) or any good heat conducting dielectric.

Thus, although the invention has been described with respect to preferred embodiments thereof, it will be understood by those skilled in the art that the foregoing and various other changes, omissions and deviations in the form and detail thereof may be made without departing from the scope of this invention.

What is claimed is:

1. An encapsulated electronic device, comprising:
    a carrier having a first surface and an opposing second surface;
    a plurality of electrically conductive bumps disposed on the first surface;
    a plurality of electrically conductive segments disposed on the second surface;
    a plurality of electrically conductive paths, provided between the first and second surfaces of the carrier, for electrically connecting the bumps to the electrically conductive segments on the second surface;

a die having a first surface and a second surface, the die disposed on top of the bumps, electrically connecting the first surface of the die to the electrical conductive segments on the second surface of the carrier through the electrically conductive paths and the bumps, wherein the second surface of the die has an inner area and an outer area surrounding the inner area;

a laminate provided at least on the outer area of the second surface of the die and at least a part of the first surface of the carrier; and a hermetic seal layer covering the laminate, the inner area of the second surface of the die, and another part of the first surface of the carrier, wherein the hermetic seal layer comprises a thermally conductive layer, such that at least part of the hermetic seal layer is in contact with the inner area of the second surface of the die.

2. The device of claim 1, wherein the hermetic seal layer covering the inner area of the second surface of the die is thicker than the hermetic seal layer covering the laminate.

3. The device of claim 1, wherein the laminate is also provided on the inner area between the second surface of the die and the hermetic seal layer, and wherein the laminate provided on the inner area is thinner than the laminate covering the outer area of the second surface.

4. The device of claim 1, wherein the thermal conducting layer comprises a metal layer.

5. The device of claim 1, further comprising at least one heat conducting path through the carrier, thermally conducting the hermetic seal layer on the first surface of the carrier to the second surface of the carrier.

6. The device of claim 1, wherein the die comprises one or more acoustic-wave components.

7. The device of claim 1, wherein the die comprises one or more FBAR components.

8. The device of claim 7, wherein the FBAR devices comprise an acoustic mirror and a substrate, and a thermal conducting dielectric layer disposed between the acoustic mirror and the substrate.

9. The device of claim 8, wherein the thermal conducting dielectric layer comprises an aluminum nitride layer.

* * * * *